US012190961B2

(12) United States Patent
Paolucci et al.

(10) Patent No.: US 12,190,961 B2
(45) Date of Patent: Jan. 7, 2025

(54) ERASING MEMORY

(71) Applicant: MICRON TECHNOLOGY, INC., Boise, ID (US)

(72) Inventors: Giovanni Maria Paolucci, Milan (IT); Paolo Tessariol, Arcore (IT); Emilio Camerlenghi, Bergamo (IT); Gianpietro Carnevale, Bottanuco (IT); Augusto Benvenuti, Lallio (IT)

(73) Assignee: Micron Technology, Inc., Boise, ID (US)

( * ) Notice: Subject to any disclaimer, the term of this patent is extended or adjusted under 35 U.S.C. 154(b) by 233 days.

(21) Appl. No.: 17/988,090

(22) Filed: Nov. 16, 2022

(65) Prior Publication Data

US 2023/0078036 A1    Mar. 16, 2023

Related U.S. Application Data

(62) Division of application No. 17/228,807, filed on Apr. 13, 2021, now Pat. No. 11,514,987, which is a division of application No. 16/555,050, filed on Aug. 29, 2019, now Pat. No. 11,011,236.

(51) Int. Cl.
*G11C 16/16* (2006.01)
*G11C 16/04* (2006.01)
*G11C 16/24* (2006.01)
*G11C 16/30* (2006.01)

(52) U.S. Cl.
CPC .......... *G11C 16/16* (2013.01); *G11C 16/0483* (2013.01); *G11C 16/24* (2013.01); *G11C 16/30* (2013.01)

(58) Field of Classification Search
CPC ..... G11C 16/16; G11C 16/0483; G11C 16/24; G11C 16/30
See application file for complete search history.

(56) References Cited

U.S. PATENT DOCUMENTS

| | | |
|---|---|---|
| 7,906,818 B2 | 3/2011 | Pekny |
| 9,064,577 B2 | 6/2015 | Zhao et al. |
| 9,318,209 B1 | 4/2016 | Huynh et al. |
| 9,449,698 B1 | 9/2016 | Paudel et al. |
| 10,008,271 B1* | 6/2018 | Diep ............... G11C 16/26 |
| 10,049,750 B2 | 8/2018 | Sakui et al. |
| 11,011,236 B2 | 5/2021 | Paolucci et al. |

(Continued)

OTHER PUBLICATIONS

International Search Report and Written Opinion of the International Searching Authority for Application No. PCT/US2020/045846 mailed Oct. 22, 2020 (12 pages).

*Primary Examiner* — Han Yang
(74) *Attorney, Agent, or Firm* — Dicke, Billig & Czaja, PLLC

(57) ABSTRACT

Methods of operating a memory, and memory configured to perform similar methods, might include applying a negative first voltage level to a control gate of a transistor connected between a first node and a string of series-connected memory cells, increasing a voltage level applied to the first node at a particular rate while increasing the voltage level applied to the control gate of the transistor at the particular rate, and in response to the voltage level applied to the first node reaching a particular voltage level, ceasing increasing the voltage level applied to the first node and ceasing increasing the voltage level applied to the control gate of the transistor.

20 Claims, 13 Drawing Sheets

(56) References Cited

U.S. PATENT DOCUMENTS

| | | |
|---|---|---|
| 2007/0158736 A1* | 7/2007 | Arai .................. H01L 29/792 |
| | | 257/E21.679 |
| 2014/0112075 A1 | 4/2014 | Dunga et al. |
| 2014/0226414 A1 | 8/2014 | Costa et al. |
| 2018/0137922 A1 | 5/2018 | Sakui et al. |
| 2020/0143888 A1 | 5/2020 | Rabkin et al. |
| 2020/0143889 A1 | 5/2020 | Rabkin et al. |
| 2020/0143893 A1 | 5/2020 | Rabkin et al. |

* cited by examiner

ERASING MEMORY

RELATED APPLICATION

This application is a Divisional of U.S. application Ser. No. 17/228,807, titled "ERASING MEMORY," filed Apr. 13, 2021, which is a Divisional of U.S. application Ser. No. 16/555,050, titled "ERASING MEMORY," filed Aug. 29, 2019, issued as U.S. Pat. No. 11,011,236 on May 18, 2021, which are each commonly assigned and incorporated herein by reference.

TECHNICAL FIELD

The present disclosure relates generally to memory and, in particular, in one or more embodiments, the present disclosure relates to erasing memory cells.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Memory cells are typically erased before they are programmed to a desired data state. For example, memory cells of a particular block of memory cells may first be erased and then selectively programmed. For a NAND array, a block of memory cells is typically erased by grounding all of the access lines (e.g., word lines) in the block and applying an erase voltage to the channel regions of the memory cells (e.g., through data lines and source connections) in order to remove charges that might be stored on data-storage structures (e.g., floating gates or charge traps) of the block of memory cells. Typical erase voltages might be on the order of 20V or more before completion of an erase operation.

DETAILED DESCRIPTION

Figure 1:
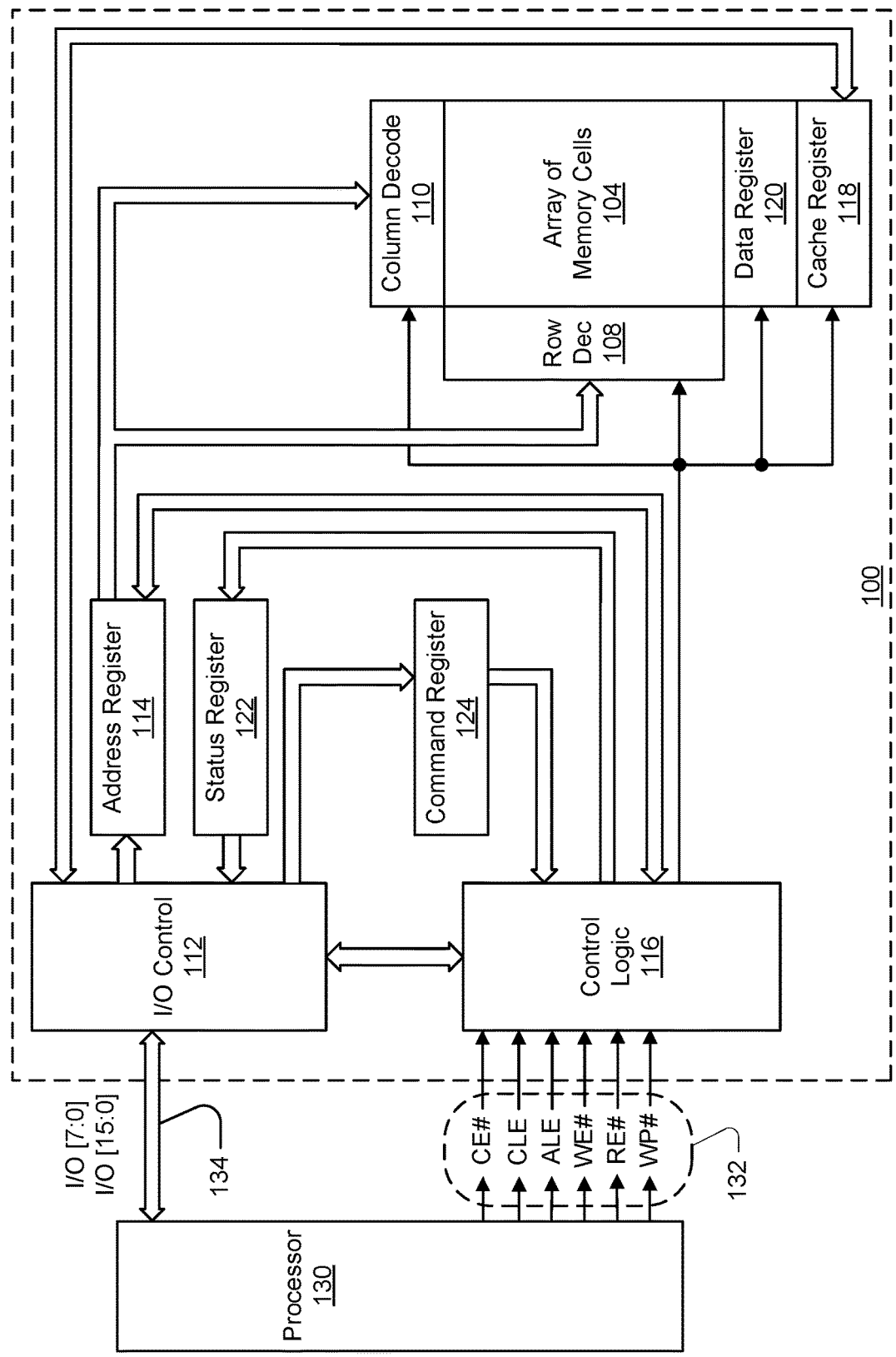
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. Unless expressly defined, elements, waveforms and/or other representations of the various figures may not be drawn to scale. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOT) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which may include read operations and verify operations], programming operations and/or erase operations) on the array of memory cells 104, and might be configured to perform methods in accordance with embodiments. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
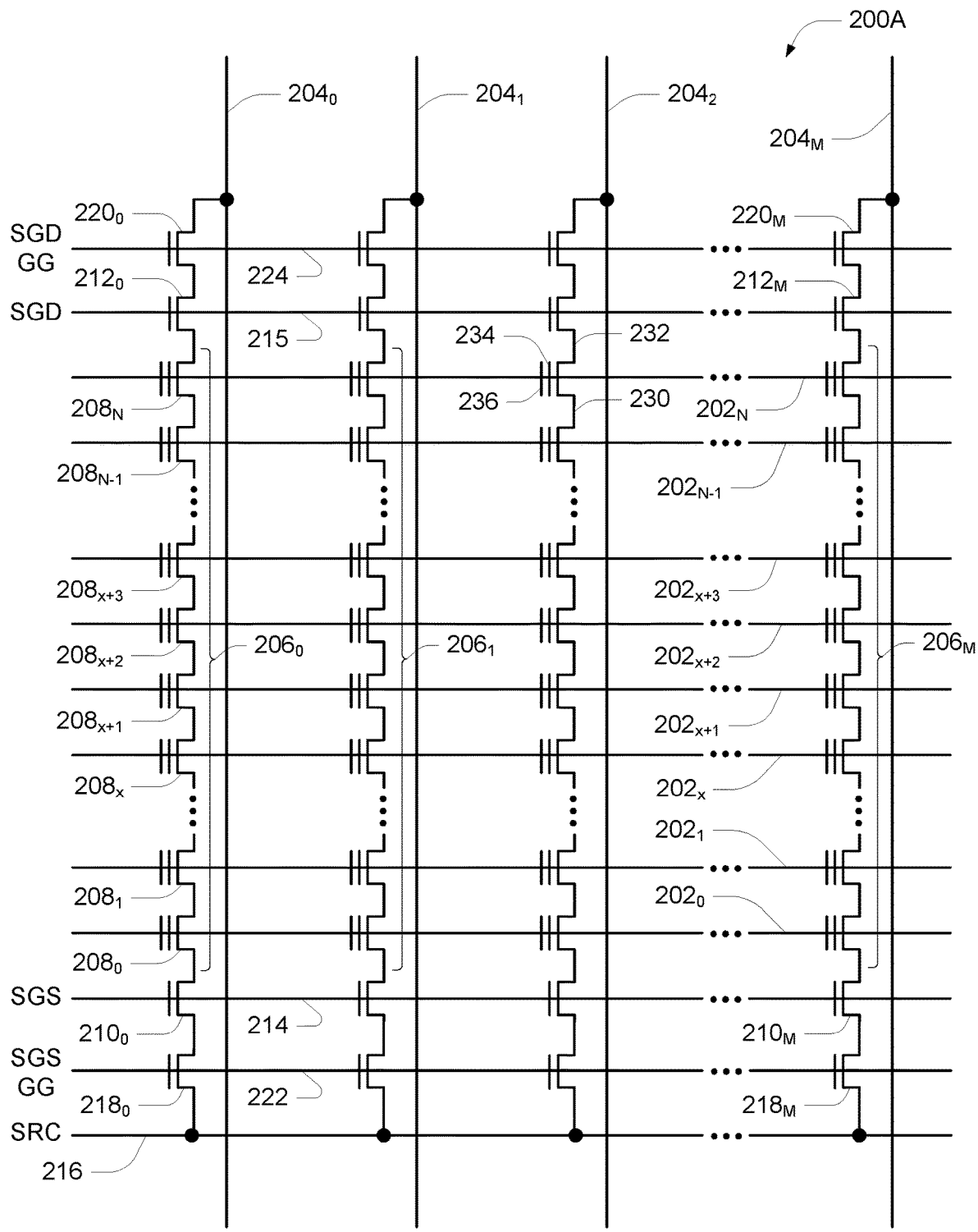
FIGS. 2A-2B are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. Some of the memory cells 208 might represent dummy memory cells, e.g., memory cells not intended to store user data. Dummy memory cells are typically not accessible to a user of the memory, and are typically incorporated into the NAND string 206 for operational advantages, as are well understood.

The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal. A control gate of each select gate 210 might be connected to select line 214. A control gate of each select gate 212 might be connected to select line 215.

The select gates 210 for each NAND string 206 might be connected in series between its memory cells 208 and a GIDL (gate-induced drain leakage) generator gate 218 (e.g., a field-effect transistor), such as one of the GIDL generator (GG) gates $218_0$ to $218_M$. The GG gates $218_0$ to $218_M$ might be referred to as source GG gates. The source GG gates $218_0$ to $218_M$ might each be connected (e.g., directly connected) to the source 216, and selectively connected to their respective NAND strings $206_0$ to $206_M$. Alternatively, a source select gate 210 and its GG gate 218 might represent a single gate, e.g., connected (e.g., directly connected) to the source 216, and connected (e.g., directly connected) to a respective NAND string 206. The select gates 212 of each NAND string 206 might be connected in series between its memory cells 208 and a GG gate 220 (e.g., a field-effect transistor), such as one of the GG gates $220_0$ to $220_M$. The GG gates $220_0$ to $220_M$ might be referred to as drain GG gates. The drain GG gates $220_0$ to $220_M$ might be connected (e.g., directly connected) to their respective data lines $204_0$ to $204_M$, and selectively connected to their respective NAND strings $206_0$ to $206_M$. Alternatively, a drain select gate 212 and its GG gate 220 might represent a single gate, e.g., connected (e.g., directly connected) to a respective data line 204, and connected (e.g., directly connected) to a respective NAND string 206.

GG gates $218_0$ to $218_M$ might be commonly connected to a control line 222, such as an SGS_GG control line, and GG gates $220_0$ to $220_M$ might be commonly connected to a control line 224, such as an SGD_GG control line. Although depicted as traditional field-effect transistors, the GG gates 218 and 220 may utilize a structure similar to (e.g., the same as) the memory cells 208. The GG gates 218 and 220 might represent a plurality of GG gates connected in series, with each GG gate in series configured to receive a same or independent control signal. In general, the GG gates 218 and 220 may have threshold voltages different than (e.g., lower than) the threshold voltages of the select gates 210 and 212, respectively. Threshold voltages of the source GG gates 218 might be different than (e.g., higher than) threshold voltages of the drain GG gates 220. Threshold voltages of the GG gates 218 and 220 may be of an opposite polarity than, and/or may be lower than, threshold voltages of the select gates 210 and 212. For example, the select gates 210 and 212 might have positive threshold voltages (e.g., 2V to 4V), while the GG gates 218 and 220 might have negative threshold voltages (e.g., −1V to −4V). The GG gates 218 and 220 might be provided to assist in the generation of GIDL current into a channel region of their corresponding NAND string 206 during an erase operation, for example.

A source of each GG gate 218 might be connected to common source 216. The drain of each GG gate 218 might be connected to a select gate 210 of the corresponding NAND string 206. For example, the drain of GG gate $218_0$ might be connected to the source of select gate $210_0$ of the corresponding NAND string $206_0$. Therefore, in cooperation, each select gate 210 and GG gate 218 for a corresponding NAND string 206 might be configured to selectively connect that NAND string 206 to common source 216. A control gate of each GG gate 218 might be connected to control line 222.

The drain of each GG gate 220 might be connected to the bit line 204 for the corresponding NAND string 206. For example, the drain of GG gate $220_0$ might be connected to the bit line $204_0$ for the corresponding NAND string $206_0$. The source of each GG gate 220 might be connected to a select gate 212 of the corresponding NAND string 206. For example, the source of GG gate $220_0$ might be connected to select gate $212_0$ of the corresponding NAND string $206_0$. Therefore, in cooperation, each select gate 212 and GG gate 220 for a corresponding NAND string 206 might be configured to selectively connect that NAND string 206 to the corresponding bit line 204. A control gate of each GG gate 220 might be connected to control line 224.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
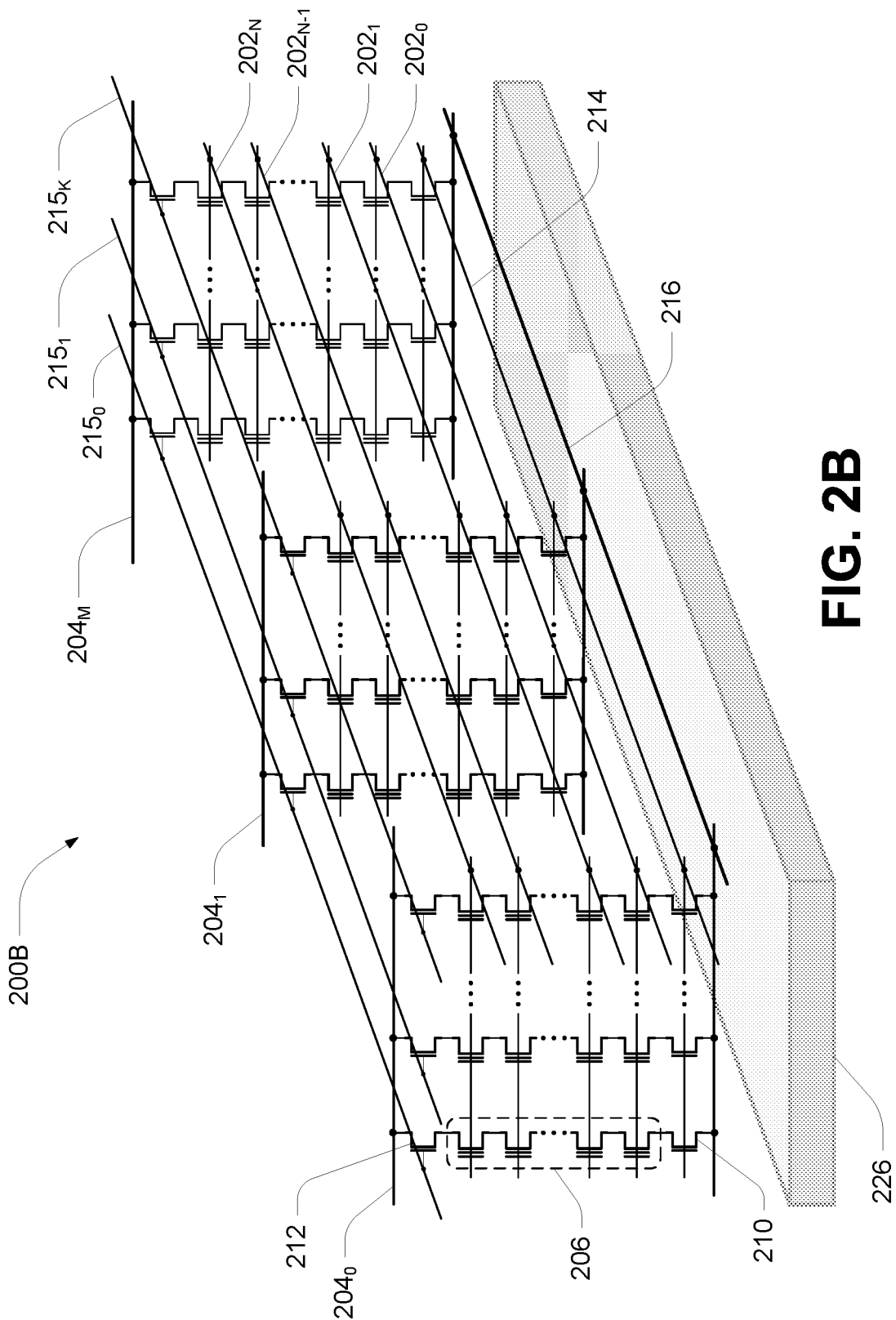

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a body and a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 3:
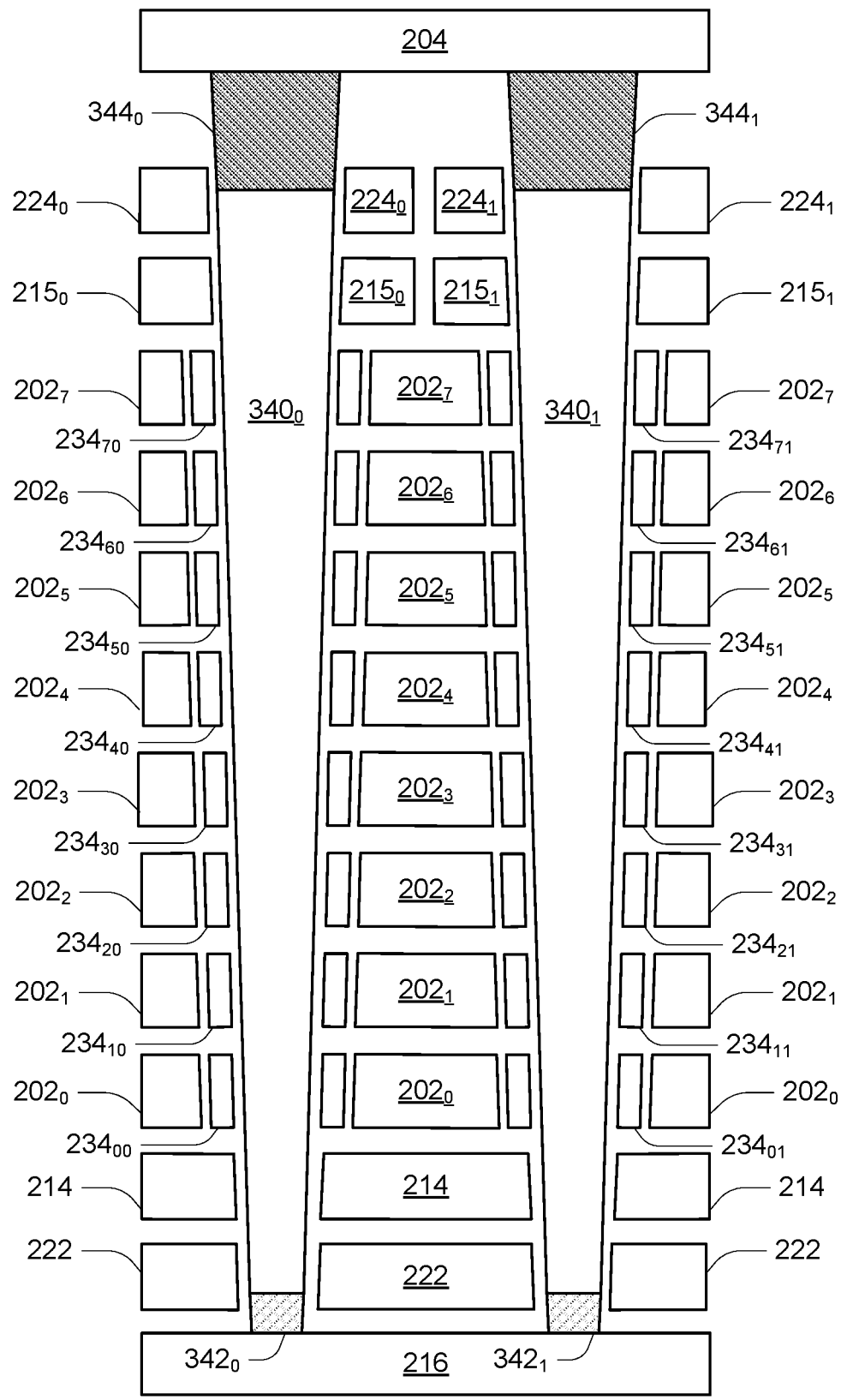
FIG. 3 is a cross-sectional view of strings of series-connected memory cells as could be used in a memory of the type described with reference to FIG. 1.

FIG. 3 is a cross-sectional view of strings of series-connected memory cells as could be used in a memory of the type described with reference to FIG. 1. Three-dimensional memory arrays are typically fabricated by forming alternating layers of conductors and dielectrics, forming holes in these layers, forming additional materials on sidewalls of the holes to define gate stacks for memory cells and other gates, and subsequently filling the holes with a semiconductor material to define a pillar to act as bodies (e.g., channel regions) of the memory cells and select gates. To improve conductivity of pillars and an adjacent semiconductor material, e.g., upon which they are formed, a conductive (e.g., conductively-doped) portion is typically formed in the hole at an interface with the adjacent semiconductor material. These conductive portions are typically formed of a different conductivity type than the pillar and adjacent semiconductor material. For example, if the pillar is formed of a P-type semiconductor material, the conductive portion might have an N-type conductivity. FIG. 3 depicts a basic structure of strings of series-connected memory cells formed in this manner. In FIG. 3, two strings of series-connected memory cells (e.g., NAND strings) are depicted in the cross-sectional view. It is noted that the spaces between various elements of the figure may represent dielectric material.

With reference to FIG. 3, a first NAND string includes a first pillar $340_0$. The first pillar $340_0$ may be formed of a semiconductor material of a first conductivity type, such as a P-type polysilicon. Conductive portion $342_0$ may be formed at the bottom of the pillar $340_0$, with the conductive portion $342_0$ electrically connected to the source 216. The conductive portion $342_0$ may be formed of a semiconductor material of a second conductivity type different than the first conductivity type. For the example where the first pillar $340_0$ might be formed of a P-type polysilicon, the conductive portion $342_0$ might be formed of an N-type semiconductor material, such as an N-type polysilicon. In addition, the conductive portion $342_0$ might have a higher conductivity level than the pillar $340_0$. For example, the conductive portion $342_0$ might have an N+ conductivity. Alternatively, the conductive portion $342_0$ may be formed of a conductor, e.g., a metal or metal silicide.

The pillar $340_0$ is electrically connected to the data line 204 through a conductive plug $344_0$. The conductive plug $344_0$, in this example, might also be formed of a semiconductor material of the second conductivity type, and may likewise have a higher conductivity level than the pillar $340_0$. Alternatively, the conductive plug $344_0$ may be formed of a conductor, e.g., a metal or metal silicide. The first NAND string further includes a source GG gate at an intersection of the control line 222 and the pillar $340_0$, and a drain GG gate at an intersection of the control line $224_0$ and the pillar $340_0$. The first NAND string further includes a source select gate at an intersection of the source select line 214 and the pillar $340_0$, and a drain select gate at an intersection of the drain select line $215_0$ and the pillar $340_0$. The first NAND string further includes a memory cell at an intersection of each of the access lines $202_0$-$202_7$ and the pillar $340_0$. These memory cells further include data-storage structures $234_{00}$-$234_{70}$. While the structure of FIG. 3 is depicted to include only eight access lines 202 in an effort to improve readability of the figure, a typical NAND structure might have significantly more access lines 202.

Although not all numbered, for clarity of FIG. 3, data-storage structures 234 are depicted on both sides of the pillars 340. Individual data-storage structures 234 may wrap completely around their respective pillar 340, thus defining a data-storage structure 234 for a single memory cell. Alternatively, structures are known having segmented data-storage structures 234, such that more than one (e.g., two) memory cells are defined at each intersection of an access line 202 and a pillar 340. Embodiments described herein are independent of the number of memory cells defined around a pillar 340. However, an example of a segmented data storage structure might be found in U.S. Pat. No. 7,906,818 to Pekny.

With further reference to FIG. 3, a second NAND string includes the second pillar $340_1$. The second pillar $340_1$ may be formed of a semiconductor material of the first conductivity type, such as a P-type polysilicon. Conductive portion $342_1$ may be formed at the bottom of the pillar $340_1$ with the conductive portion $342_1$ electrically connected to the source 216. The conductive portion $342_1$ may be formed of a semiconductor material of the second conductivity type. For the example where the pillar $340_1$ might be formed of a P-type polysilicon, the conductive portion $342_1$ might be formed of an N-type semiconductor material, such as an N-type polysilicon. In addition, the conductive portion $342_1$ might have a higher conductivity level than the pillar $340_1$. For example, the conductive portion $342_1$ might have an N+ conductivity.

The pillar $340_1$ is electrically connected to the data line 204 through a conductive plug $344_1$. The conductive plug $344_1$, in this example, might also be formed of a semiconductor material of the second conductivity type, and may likewise have a higher conductivity level than the pillar $340_1$. Alternatively, the conductive plug $344_1$ may be formed of a conductor, e.g., a metal or metal silicide. The second NAND string further includes a source GG gate at an intersection of the control line 222 and the pillar $340_1$, and a drain GG gate at an intersection of the control line $224_1$ and the pillar $340_1$. The second NAND string further includes a source select gate at an intersection of the source select line 214 and the pillar $340_1$, and a drain select gate at an intersection of the drain select line 2151 and the pillar $340_1$. The second NAND string further includes a memory cell at an intersection of each of the access lines $202_0$-$202_7$ and the pillar $340_1$. These memory cells further include data-storage structures $234_{01}$-$234_{71}$.

Forming holes through multiple layers typically produces holes of decreasing diameter toward the bottom of the holes due to the nature of the removal processes commonly used in the semiconductor industry. To mitigate against the holes becoming too narrow, formation of arrays of the type described with reference to FIGS. 2A-2B, might be segmented, such that the layers for forming a first portion of the NAND string may be formed, then portions may be removed to define holes, and the remaining structures may be formed within the holes. Following formation of the first portion of the NAND string, a second portion of the NAND string might be formed over the first portion in a similar manner. Although the embodiments are not dependent on the nature of the array structure, an example of a segmented array structure might be found in U.S. Pat. No. 10,049,750 to Sakui et al.

Typically, an erase operation on memory cells of NAND strings includes a series of erase pulses (e.g., Pulse 1, Pulse 2, Pulse 3, . . . ) applied to the NAND strings through their respective data lines 204 and source 216 while voltages are applied to the access lines 202 having a polarity and magnitude expected to remove charge from the data storage structures of the memory cells while the erase pulse is applied to the NAND strings. An erase verify operation may be performed between pulses to determine if the memory cells have been sufficiently erased (e.g., have threshold voltages at or below some target value). If the erase verify is failed, another erase pulse, typically having a higher voltage level, may be applied.

Erase operations typically utilize GIDL (gate-induced drain leakage) to provide current to the pillars 340, e.g., to the bodies of the memory cells, sufficient to sustain the erase operation. GIDL current might be produced by applying a voltage level of the control lines 222 and/or 224 that is less than the voltage levels applied to the data lines 204 and the source 216. Due to differing characteristics at opposing ends of the NAND string, the voltage level applied to the control line 222 for the source GG gate may be different than the voltage level applied to the control line 224 for the drain GG gate, even where the data line 204 and the source 216 receive the same voltage level.

Although different voltage levels might be applied to the control line 222 and the control line 224, the voltage differential from the source 216 and the data line 204, respectively, might be chosen to be substantially equal (e.g., equal) to facilitate similar (e.g., equal) levels of GIDL current. For example, the voltage level applied to the control line 222 might be 5V less than the voltage level applied to the source 216, and the voltage levels applied to the control line 224 might be 5V less than the voltage level applied to the data line 204. Voltage levels applied to select lines 214 or 215 might be selected to reduce stress during the erase operation, and thus might have some value between the voltage level applied to the control line for the corresponding GG gate, e.g., control lines 222 or 224, respectively, and the voltage level applied to the source 216 or data line 204, respectively. Selection of the various voltage levels may generally be dependent upon the array architecture, materials of construction and/or processing conditions, and is within the abilities of one of ordinary skill in the art of semiconductor fabrication. Table 1 provides some example voltage levels that might be used with embodiments.

TABLE 1

|  | Pulse 1 | Pulse 2 | Pulse 3 |
|---|---|---|---|
| Data Line 204 | 15 V | 17 V | 19 V |
| Control Line 224 | 10 V | 12 V | 14 V |
| Access Lines 202 | 1 V | 1 V | 1 V |
| Control Line 222 | 10 V | 12 V | 14 V |
| Source 216 | 15 V | 17 V | 19 V |

While the example of Table 1 shows the same voltage differences being applied between the source 216 and the control line 222, and between the data lines 204 and the control line 224 for each erase pulse, due to the differing characteristics, the voltage differences for opposing ends of the NAND string might be different. For example, the voltage difference between the voltage level applied to the control line 222 and the voltage level applied to the source 216 might be different than (e.g., greater than) the voltage difference between the voltage level applied to the control line 224 and the voltage level applied to a data line 204.

The GIDL current generated by the voltage differential between the source 216 and control line 222, and/or between the data line 204 and the control line 224, might depend exponentially on the magnitude of the voltage differential, which may be referred to as offset. For example, higher offset might produce higher levels of GIDL current. However, higher levels of offset might also lead to degradation of the GG gates.

Figure 4A:
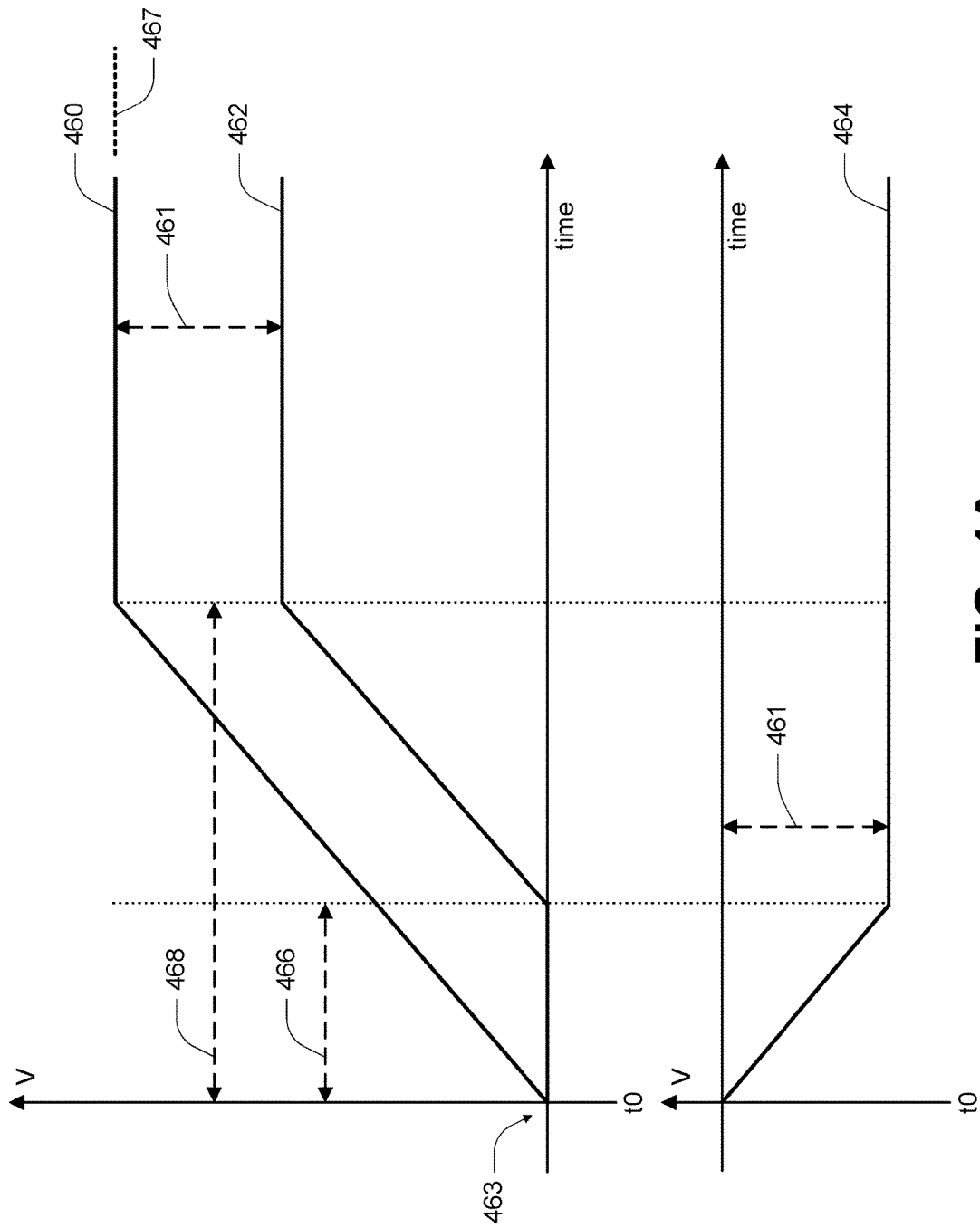
FIG. 4A conceptually depicts waveforms of voltage levels for generating GIDL current of the related art.

FIG. 4A conceptually depicts waveforms of voltage levels for generating GIDL current of the related art. In FIG. 4A, the waveform 460 might represent the voltage level applied to the source 216 (or data line 204), the waveform 462 might represent the voltage level applied to the control line 222 (or control line 224), and the waveform 464 might represent the voltage difference between the waveform 462 and the waveform 460. The waveform 460 might represent an erase pulse of an erase operation.

At time t0, the voltage level of the waveform 460 might begin increasing (e.g., ramping) from an initial voltage level 463 (e.g., ground or 0V) while the voltage level of the waveform 462 might remain at the initial voltage level. As a result, the voltage difference of the waveform 464 might begin increasing in magnitude. After time period 466, the voltage difference of the waveform 464 might reach a target (e.g., desired) magnitude 461, and the voltage level of the waveform 462 might begin increasing from the initial voltage level at a same rate (e.g., a same ramp rate) as the rate of increase of the voltage level of the waveform 460 to maintain the magnitude 461 of the voltage difference of the waveform 464.

After time period 468, the voltage level of the waveform 460 might reach a target (e.g., desired) voltage level 467 to perform the erase operation. At this time, the voltage levels of the waveforms 460 and 462 might be maintained, e.g., by ceasing increasing their respective voltage levels. In reference to FIG. 4A, the desired levels of GIDL current might only be produced after the end of time period 466 when the magnitude 461 of the voltage difference of the waveform 464 reaches its target level.

During the time period 466, the GG gates might develop high longitudinal E-fields to compensate for displacement current, which might be equal to the ramp rate of the voltage level of the waveform 460 times a capacitance of its corresponding semiconductor pillar 340. To reduce damage from such E-fields, the ramp rate can be reduced. Once the magnitude 461 of the voltage difference of the waveform 464 reaches its target level, desired levels of GIDL current can be produced with lower longitudinal fields and the voltage level of the corresponding semiconductor pillar 340 can more easily follow the voltage level of the source 216 (or data line 204).

Figure 4B:
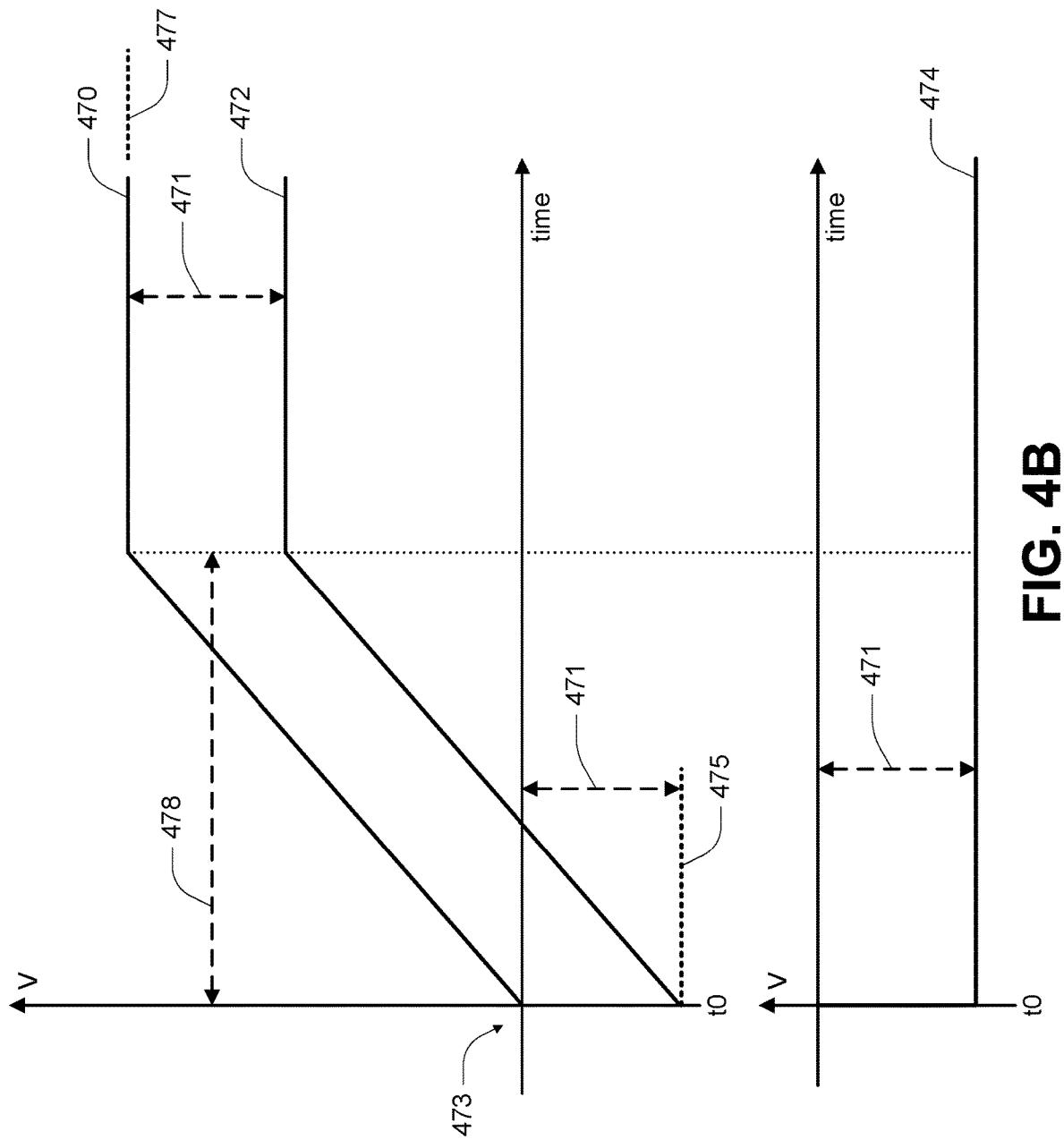
FIG. 4B conceptually depicts waveforms of voltage levels for generating GIDL current in accordance with an embodiment.

FIG. 4B conceptually depicts waveforms of voltage levels for generating GIDL current in accordance with an embodiment. In FIG. 4B, the waveform 470 might represent the voltage level applied to the source 216 (or data line 204), the waveform 472 might represent the voltage level applied to the control line 222 (or control line 224), and the waveform 474 might represent the voltage difference between the waveform 472 and the waveform 470.

At time t0, the voltage level of the waveform 470 might begin increasing (e.g., ramping) from a first (e.g., initial) voltage level 473 (e.g., ground or 0V). The voltage level of the waveform 472 might begin increasing from a second (e.g., initial) voltage level 475, lower than the first voltage level 473 of the waveform 470, e.g., a negative voltage level. The voltage difference between the second voltage level 475 and the first voltage level 473 might be selected to be substantially equal to (e.g., equal to) the desired level of offset. As a result, the voltage difference of the waveform 474 might reach its target (e.g., desired) magnitude 471 at, or near, time 0. The voltage level of the waveform 472 might begin increasing from the second voltage level 475 at a same rate (e.g., a same ramp rate) as the rate of increase of the voltage level of the waveform 470 to maintain the magnitude 471 of the voltage difference of the waveform 474.

Figure 5:
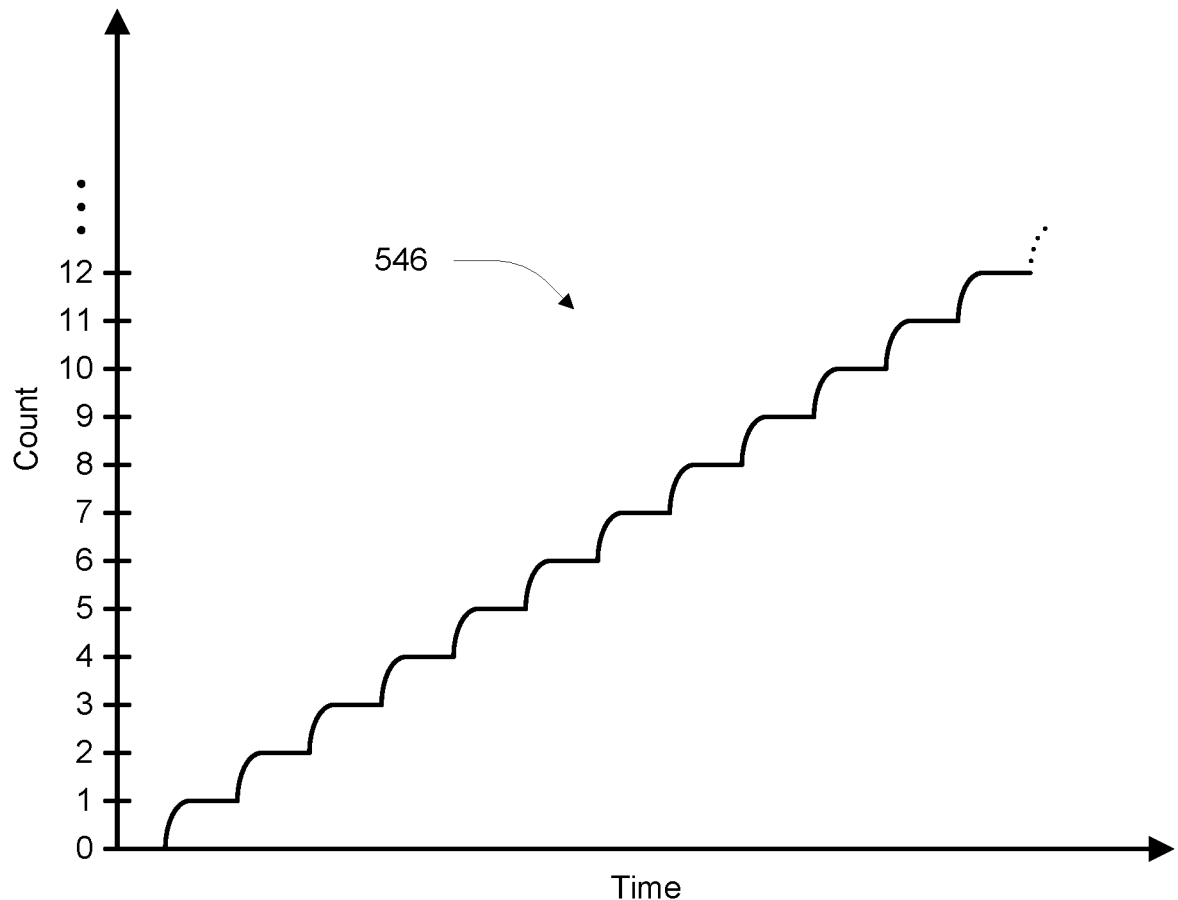
FIG. 5 is a depiction of a ramped voltage level for use with various embodiments.

After time period 478, the voltage level of the waveform 470 might reach a target (e.g., desired) voltage level 477 to perform the erase operation. At this time, the voltage levels of the waveforms 470 and 472 might be maintained, e.g., by ceasing increasing their respective voltage levels. In reference to FIG. 4B, the desired levels of GIDL current might be produced for an entire duration of an erase pulse, or for a longer portion of the duration of the erase pulse as compared to the example of FIG. 4A. As such, exposure to high longitudinal E-fields might be mitigated. This might further facilitate higher ramp rates of the erase pulse, and/or higher levels of offset, which could shorten the duration of an erase operation Voltage levels of the type discussed with reference to FIG. 4B are often generated using voltage generation systems using digital to analog conversion. For example, a ramping voltage level might be produced responsive to a counter. FIG. 5 is a depiction of a ramped voltage level 546 for use with various embodiments. The ramped (e.g., increasing) voltage level has a voltage level (e.g., changing voltage level) that is responsive to a count. For example, as values of the counts increase, the voltage level of the ramped voltage level increases in response. The ramped voltage level 546 may approximate, or more closely approximate, a linear response by increasing the number of counts used to generate a same ranges of voltage levels.

Figure 6:
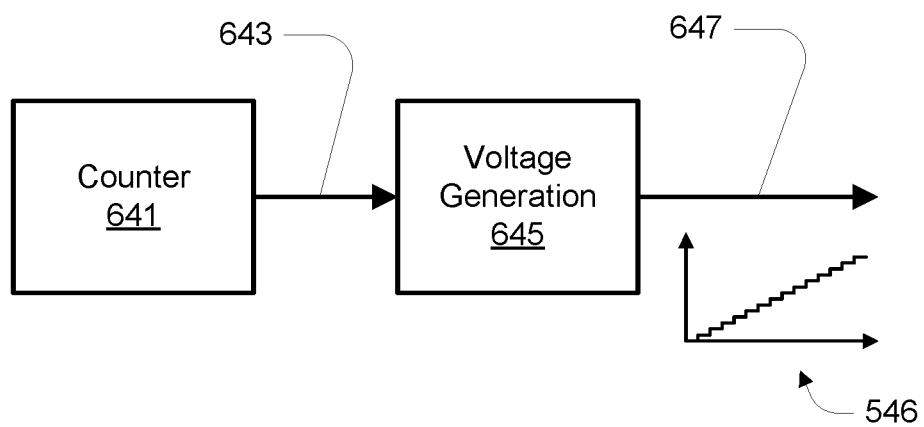
FIG. 6 is a block diagram of a voltage generation system for generating a ramped voltage level of the type depicted in FIG. 5 for use with various embodiments.

FIG. 6 is a block diagram of a voltage generation system for generating a ramped voltage level of the type depicted in FIG. 5 for use with various embodiments. The voltage generation system of FIG. 6 includes a counter 641 for producing a count. As an example, the counter 641 may have an output 643 for providing a bit pattern representative of the count. A voltage generation circuit 645, e.g., a digital-to-analog converter (DAC), might produce an analog voltage level responsive to the output 643 of the counter 641, e.g., the count. The DAC 645 might provide this voltage level at the output 647. The output 647 of the DAC 645 might be connected (e.g., selectively connected) to a source 216 and/or a data line 204.

Figure 7A:
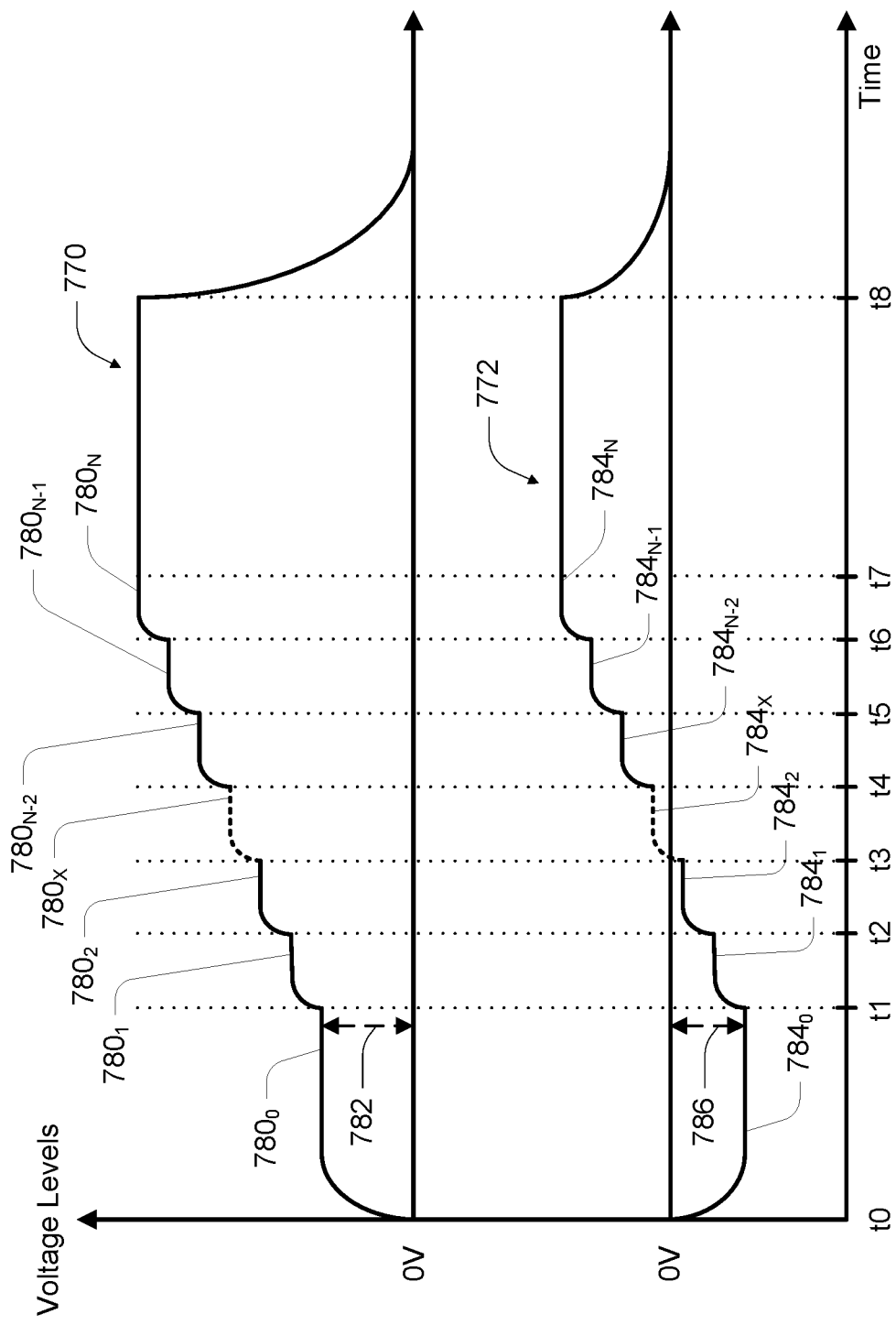
FIG. 7A conceptually depicts waveforms of voltage levels for generating GIDL current in accordance with another embodiment.

FIG. 7A conceptually depicts waveforms of voltage levels for generating GIDL current in accordance with another embodiment. FIG. 7A might represent voltage levels applied during an erase operation. In FIG. 7A, the waveform 770 might represent the voltage level applied to the source 216 (or data line 204), and the waveform 772 might represent the voltage level applied to the control line 222 (or control line 224). The waveform 770 might represent an erase pulse of the erase operation. The source 216 and the data lines 204 might each be referred to as a node selectively connected a string of series-connected memory cells, while the GG gates corresponding to the control line 222 and 224, respectively, might be referred to as being connected between their corresponding node (e.g., the source 216 or a data line 204, respectively) and their corresponding string of series-connected memory cells, which might include being connected to (e.g., directly connected to) their corresponding node (e.g., the source 216 or a data line 204, respectively) and selectively connected to their corresponding string of series-connected memory cells.

At time t0, waveform 770 and waveform 772 might each be at an initial voltage level, e.g., 0V. Also at time t0, for the time period t0-t1, the voltage level of the waveform 770 might be increased to a voltage level $780_0$, which might have a magnitude 782 above the initial voltage level, and the voltage level of the waveform 772 might be decreased to a voltage level $784_0$, which might have a magnitude 786 below the initial voltage level. A sum of the magnitude 782 and the magnitude 786 might be equal to the desired offset for the erase operation.

At time t1, for the time period t1-t2, the voltage level of the waveform 770 might be increased to a voltage level $780_1$ and the voltage level of the waveform 772 might be increased to a voltage level $784_1$. The magnitude of the voltage level increase of the waveform 770 for the time period t1-t2 might be equal to a difference between the voltage level $780_1$ and the voltage level $780_0$, while the magnitude of the voltage level increase of the waveform 772 for the time period t1-t2 might be equal to a difference between the voltage level $784_1$ and the voltage level $784_0$. The magnitude of the voltage level increase of the waveform 770 for the time period t1-t2 might be equal to the magnitude of the voltage level increase of the waveform 772 for the time period t1-t2, such that the rate of increase might be deemed to be the same.

At time t2, for the time period t2-t3, the voltage level of the waveform 770 might be increased to a voltage level $780_2$ and the voltage level of the waveform 772 might be increased to a voltage level $784_2$. The magnitude of the voltage level increase of the waveform 770 for the time period t2-t3 might be equal to a difference between the voltage level $780_2$ and the voltage level $780_1$, while the magnitude of the voltage level increase of the waveform 772 for the time period t2-t3 might be equal to a difference between the voltage level $784_2$ and the voltage level $784_1$. The magnitude of the voltage level increase of the waveform 770 for the time period t2-t3 might be equal to the magnitude of the voltage level increase of the waveform 772 for the time period t2-t3, such that the rate of increase might be deemed to be the same.

At time t3, for the time period t3-t4, the voltage level of the waveform 770 might be increased to a voltage level $780_X$ and the voltage level of the waveform 772 might be increased to a voltage level $784_X$. The magnitude of the voltage level increase of the waveform 770 for the time period t3-t4 might be equal to a difference between the voltage level $780_X$ and the voltage level $780_2$, while the magnitude of the voltage level increase of the waveform 772 for the time period t3-t4 might be equal to a difference between the voltage level $784_X$ and the voltage level $784_X$. The magnitude of the voltage level increase of the waveform 770 for the time period t3-t4 might be equal to the magnitude of the voltage level increase of the waveform 772 for the time period t3-t4, such that the rate of increase might be deemed to be the same. The steps of the waveforms 770 and 772 for the time period t3-t4 are depicted as dashed lines to represent that more than one step of the applied voltage level might occur between time t3 and time 4

At time t4, for the time period t4-t5, the voltage level of the waveform 770 might be increased to a voltage level $780_{N-2}$ and the voltage level of the waveform 772 might be increased to a voltage level $784_{N-2}$. The magnitude of the voltage level increase of the waveform 770 for the time period t4-t5 might be equal to a difference between the voltage level $780_{N-2}$ and the voltage level $780_X$, while the magnitude of the voltage level increase of the waveform 772 for the time period t4-t5 might be equal to a difference between the voltage level $784_{N-2}$ and the voltage level $784_X$. The magnitude of the voltage level increase of the waveform 770 for the time period t4-t5 might be equal to the magnitude of the voltage level increase of the waveform 772 for the time period t4-t5, such that the rate of increase might be deemed to be the same.

At time t5, for the time period t5-t6, the voltage level of the waveform 770 might be increased to a voltage level $780_{N-1}$ and the voltage level of the waveform 772 might be increased to a voltage level $784_{N-1}$. The magnitude of the voltage level increase of the waveform 770 for the time period t5-t6 might be equal to a difference between the voltage level $780_{N-1}$ and the voltage level $780_{N-2}$, while the magnitude of the voltage level increase of the waveform 772 for the time period t5-t6 might be equal to a difference between the voltage level $784_{N-1}$ and the voltage level $784_{N-2}$. The magnitude of the voltage level increase of the waveform 770 for the time period t5-t6 might be equal to the magnitude of the voltage level increase of the waveform 772 for the time period t5-t6, such that the rate of increase might be deemed to be the same.

At time t6, for the time period t6-t7, the voltage level of the waveform 770 might be increased to a voltage level $780_N$ and the voltage level of the waveform 772 might be increased to a voltage level $784_N$. The magnitude of the voltage level increase of the waveform 770 for the time period t6-t7 might be equal to a difference between the voltage level $780_N$ and the voltage level $780_{N-1}$, while the magnitude of the voltage level increase of the waveform 772 for the time period t6-t7 might be equal to a difference between the voltage level $784_N$ and the voltage level $784_{N-1}$. The magnitude of the voltage level increase of the waveform 770 for the time period t6-t7 might be equal to the magnitude of the voltage level increase of the waveform 772 for the time period t6-t7, such that the rate of increase might be deemed to be the same.

At time t7, when the waveform 770 has the voltage level $780_N$, increases in the voltage levels of the waveforms 770 and 772 might be ceased. During the time period t7-t8, a voltage level might be applied to a control gate of a memory cell 208 of a string of series-connected memory cells selectively connected to the source 216 (or a data line 204) that might be expected to remove charge from a data storage structure of the memory cell, e.g., in conjunction with the voltage level $780_N$ applied to the source 216 (or a data line 204). At time t8, voltage levels of the waveforms 770 and 772 might be discharged, e.g., to the initial voltage level. An erase verify operation might then be performed to determine whether the memory cells are sufficiently erased, or whether another, e.g., higher, erase pulse might be applied.

The slope of a voltage level increase for a particular time period, e.g., t1-t2, t2-t3, t3-t4, etc. between time t1 and time t7, might be defined as the magnitude of the voltage level increase for that time period divided by a duration of that time period. The slopes of the voltage level increases for the successive time periods t1-t2, t2-t3, t3-t4, etc., might be equal, such that the rate of increase might be deemed to be constant. For some embodiments, the magnitudes and durations of these time periods might also be equal. Alternatively, the slopes of the voltage level increases for the successive time periods t1-t2, t2-t3, t3-t4, etc., might include a plurality of different slope values, such that the rate of increase might be deemed to be variable.

Figure 7B:
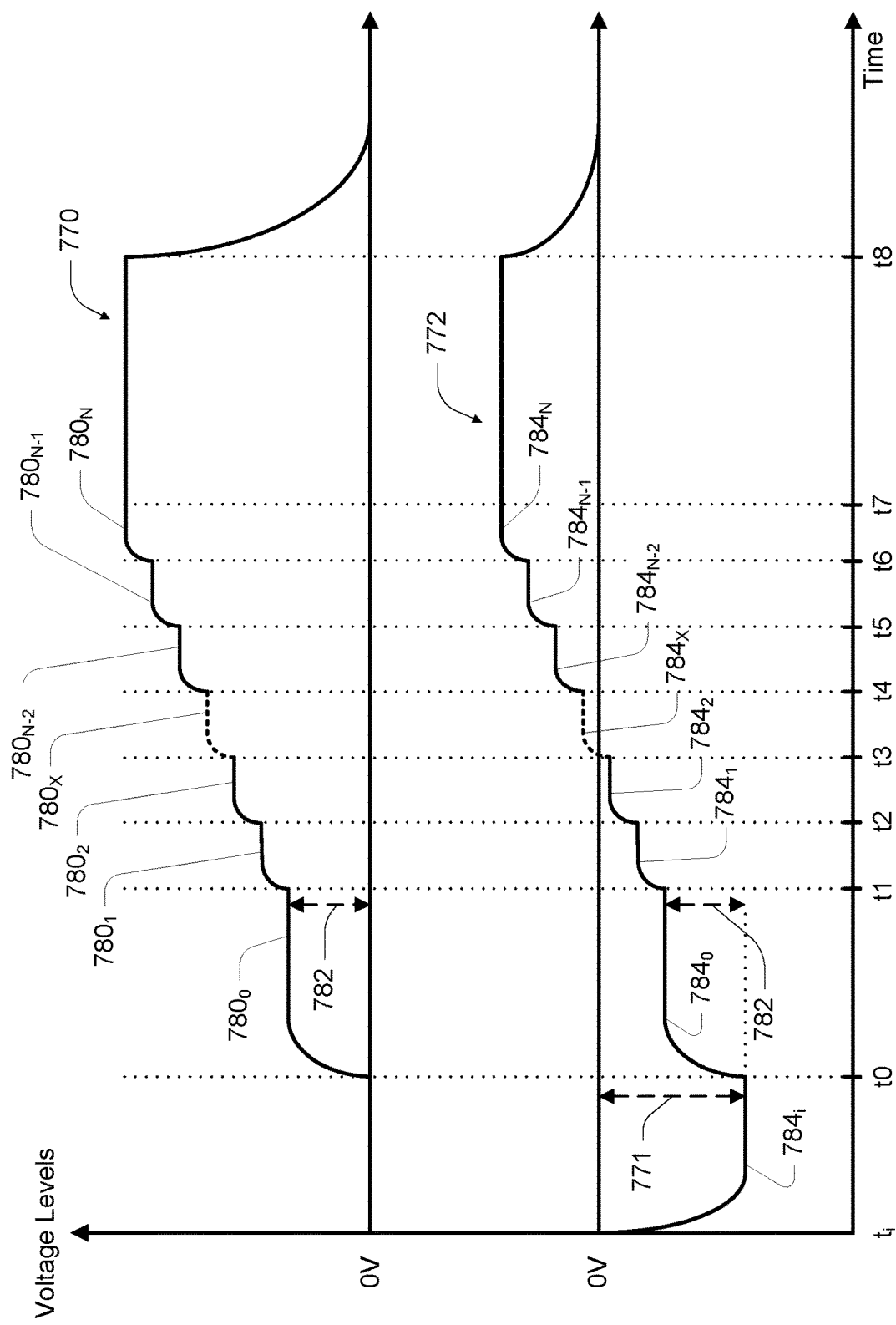
FIG. 7B conceptually depicts waveforms of voltage levels for generating GIDL current in accordance with a further embodiment.

FIG. 7B conceptually depicts waveforms of voltage levels for generating GIDL current in accordance with a further embodiment. FIG. 7B might represent voltage levels applied during an erase operation. In FIG. 7B, the waveform 770 might represent the voltage level applied to the source 216 (or data line 204), and the waveform 772 might represent the voltage level applied to the control line 222 (or control line 224). The waveform 770 might represent an erase pulse of the erase operation. The source 216 and the data lines 204 might each be referred to as a node selectively connected a string of series-connected memory cells, while the GG gates corresponding to the control line 222 and 224, respectively, might be referred to as being connected to (e.g., directly connected to) their corresponding node (e.g., the source 216 or a data line 204, respectively) and selectively connected to their corresponding string of series-connected memory cells.

At time $t_i$, waveform 770 and waveform 772 might each be at an initial voltage level, e.g., 0V. Also at time $t_i$, for the time period $t_i$-t0, the voltage level of the waveform 770 might be maintained at the initial voltage level, and the voltage level of the waveform 772 might be decreased to a voltage level $784_i$, which might have a magnitude 771 below the initial voltage level. The magnitude 771 might be equal to the desired offset for the erase operation.

At time to, for the time period t0-t1, the voltage level of the waveform 770 might be increased to a voltage level $780_0$, which might have a magnitude 782 above the initial voltage level, and the voltage level of the waveform 772 might be increased to a voltage level $784_0$, which might have the magnitude 782 above the voltage level $784_i$, such that the rate of increase of the waveforms 770 and 772 might be deemed to be the same for the time period t0-t1.

At time t1, for the time period t1-t2, the voltage level of the waveform 770 might be increased to a voltage level $780_1$ and the voltage level of the waveform 772 might be increased to a voltage level $784_1$. The magnitude of the voltage level increase of the waveform 770 for the time period t1-t2 might be equal to a difference between the voltage level $780_1$ and the voltage level $780_0$, while the magnitude of the voltage level increase of the waveform 772 for the time period t1-t2 might be equal to a difference between the voltage level $784_1$ and the voltage level $784_0$. The magnitude of the voltage level increase of the waveform 770 for the time period t1-t2 might be equal to the magnitude of the voltage level increase of the waveform 772 for the time period t1-t2, such that the rate of increase might be deemed to be the same.

At time t2, for the time period t2-t3, the voltage level of the waveform 770 might be increased to a voltage level $780_2$ and the voltage level of the waveform 772 might be increased to a voltage level $784_2$. The magnitude of the voltage level increase of the waveform 770 for the time period t2-t3 might be equal to a difference between the voltage level $780_2$ and the voltage level $780_1$, while the magnitude of the voltage level increase of the waveform 772 for the time period t2-t3 might be equal to a difference between the voltage level $784_2$ and the voltage level $784_1$. The magnitude of the voltage level increase of the waveform 770 for the time period t2-t3 might be equal to the magnitude of the voltage level increase of the waveform 772 for the time period t2-t3, such that the rate of increase might be deemed to be the same.

At time t3, for the time period t3-t4, the voltage level of the waveform 770 might be increased to a voltage level $780_X$ and the voltage level of the waveform 772 might be increased to a voltage level $784_X$. The magnitude of the voltage level increase of the waveform 770 for the time period t3-t4 might be equal to a difference between the voltage level $780_X$ and the voltage level $780_2$, while the magnitude of the voltage level increase of the waveform 772 for the time period t3-t4 might be equal to a difference between the voltage level $784_X$ and the voltage level $784_X$. The magnitude of the voltage level increase of the waveform 770 for the time period t3-t4 might be equal to the magnitude of the voltage level increase of the waveform 772 for the time period t3-t4, such that the rate of increase might be deemed to be the same. The steps of the waveforms 770 and 772 for the time period t3-t4 are depicted as dashed lines to represent that more than one step of the applied voltage level might occur between time t3 and time 4

At time t4, for the time period t4-t5, the voltage level of the waveform 770 might be increased to a voltage level $780_{N-2}$ and the voltage level of the waveform 772 might be increased to a voltage level $784_{N-2}$. The magnitude of the voltage level increase of the waveform 770 for the time period t4-t5 might be equal to a difference between the voltage level $780_{N-2}$ and the voltage level $780_X$, while the magnitude of the voltage level increase of the waveform 772 for the time period t4-t5 might be equal to a difference between the voltage level $784_{N-2}$ and the voltage level $784_X$. The magnitude of the voltage level increase of the waveform 770 for the time period t4-t5 might be equal to the magnitude of the voltage level increase of the waveform 772 for the time period t4-t5, such that the rate of increase might be deemed to be the same.

At time t5, for the time period t5-t6, the voltage level of the waveform 770 might be increased to a voltage level $780_{N-1}$ and the voltage level of the waveform 772 might be increased to a voltage level $784_{N-1}$. The magnitude of the voltage level increase of the waveform 770 for the time period t5-t6 might be equal to a difference between the voltage level $780_{N-1}$ and the voltage level $780_{N-2}$, while the magnitude of the voltage level increase of the waveform 772 for the time period t5-t6 might be equal to a difference between the voltage level $784_{N-1}$ and the voltage level $784_{N-2}$. The magnitude of the voltage level increase of the waveform 770 for the time period t5-t6 might be equal to the magnitude of the voltage level increase of the waveform 772 for the time period t5-t6, such that the rate of increase might be deemed to be the same.

At time t6, for the time period t6-t7, the voltage level of the waveform 770 might be increased to a voltage level $780_N$ and the voltage level of the waveform 772 might be increased to a voltage level $784_N$. The magnitude of the voltage level increase of the waveform 770 for the time period t6-t7 might be equal to a difference between the voltage level $780_N$ and the voltage level $780_{N-1}$, while the magnitude of the voltage level increase of the waveform 772 for the time period t6-t7 might be equal to a difference between the voltage level $784_N$ and the voltage level $784_{N-1}$. The magnitude of the voltage level increase of the waveform 770 for the time period t6-t7 might be equal to the magnitude of the voltage level increase of the waveform 772 for the time period t6-t7, such that the rate of increase might be deemed to be the same.

At time t7, when the waveform 770 has the voltage level $780_N$, increases in the voltage levels of the waveforms 770 and 772 might be ceased. During the time period t7-t8, a voltage level might be applied to a control gate of a memory cell 208 of a string of series-connected memory cells selectively connected to the source 216 (or a data line 204) that might be expected to remove charge from a data storage structure of the memory cell, e.g., in conjunction with the voltage level $780_N$ applied to the source 216 (or a data line 204). At time t8, voltage levels of the waveforms 770 and 772 might be discharged, e.g., to the initial voltage level. An erase verify operation might then be performed to determine whether the memory cells are sufficiently erased, or whether another, e.g., higher, erase pulse might be applied.

The slope of a voltage level increase for a particular time period, e.g., t0-t1, t1-t2, t2-t3, etc. between time t0 and time t7, might be defined as the magnitude of the voltage level increase for that time period divided by a duration of that time period. The slopes of the voltage level increases for the successive time periods t0-t1, t1-t2, t2-t3, etc., might be equal, such that the rate of increase might be deemed to be constant. Alternatively, the slopes of the voltage level increases for the successive time periods t0-t1, t1-t2, t2-t3, etc., might include a plurality of different slope values, such that the rate of increase might be deemed to be variable. For some embodiments, the magnitudes and durations of these time periods might vary. For example, the slope of the voltage level increase for the time period t0-t1 (e.g., a first time period of a plurality of successive time periods) might be different than (e.g., greater than) the slope of the voltage level increase for the time period t1-t2. For some embodiments, the slope of each time period of the plurality of successive time periods other than the first time period of the plurality of successive time periods might be equal.

Figure 8:
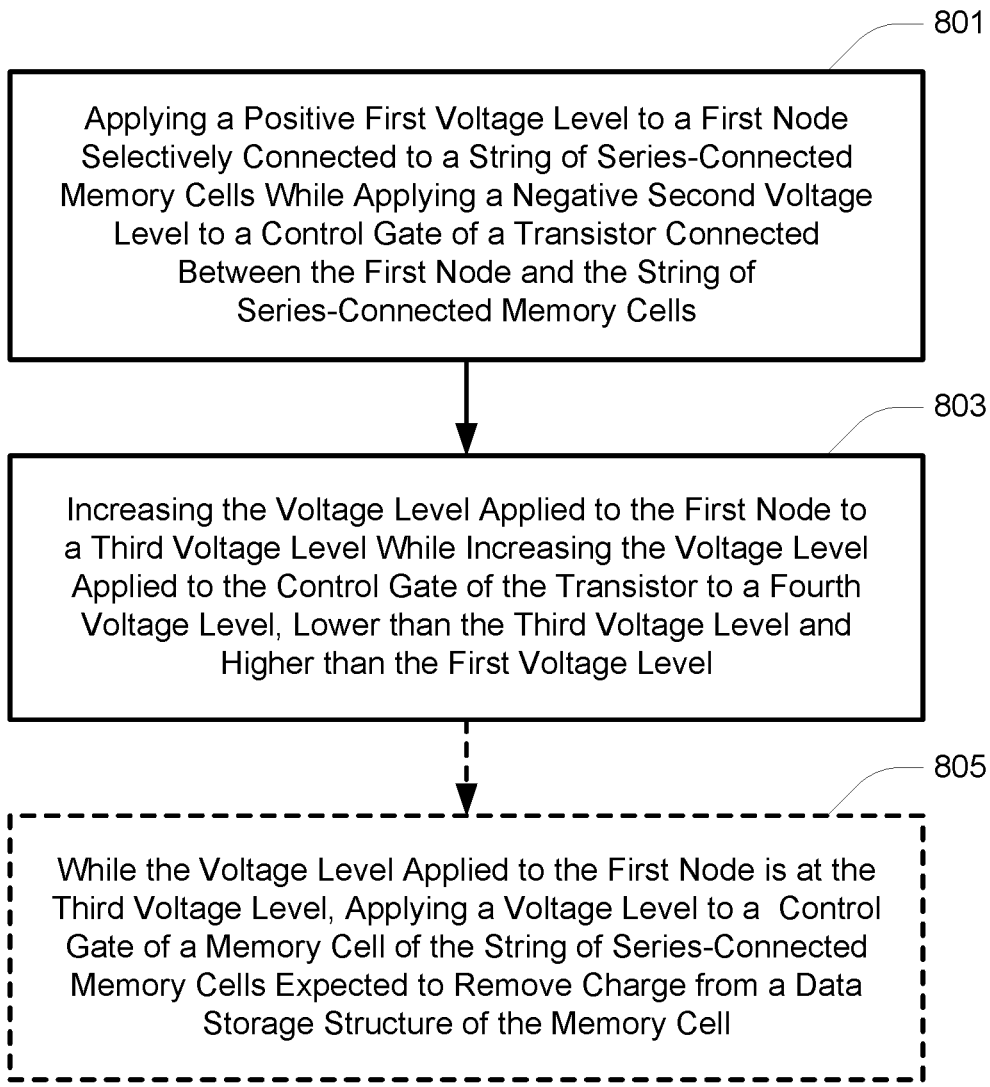
FIG. 8 is a flowchart of a method of operating a memory in accordance with an embodiment.

FIG. 8 is a flowchart of a method of operating a memory in accordance with an embodiment. For example, the method of FIG. 8 might represent a portion of an erase operation.

At 801, a positive first voltage level might be applied to a first node selectively connected to a string of series-connected memory cells while applying a negative second voltage level to a control gate of a transistor connected to the first node and selectively connected to the string of series-connected memory cells. As an example, with reference to FIG. 2A, the first voltage level might be applied to the source 216 while the second voltage level might be applied to the control line 222. Alternatively, the first voltage level might be applied to the data line $204_0$ while the second voltage level might be applied to the control line 224. A voltage difference between the first voltage level and the second voltage level might be equal to the desired offset for the erase operation. This action might correspond to the voltage level of waveform 770 at time t1 of FIG. 7A or FIG. 7B, and to the voltage level of waveform 772 at time t1 of FIG. 7A or FIG. 7B, for example.

While it will be understood that the method of FIG. 8 might be performed with respect to the source 216 and the control line 222, and/or with respect to a data line 204 (e.g., or a plurality of data lines 204) and the control line 224, the remaining discussion of FIG. 8 will be described with reference to the source 216 corresponding to the first node selectively connected to a string of series-connected memory cells, and the control line 222 corresponding to the voltage level applied to the control gate of a transistor 218 connected to the first node and selectively connected to the string of series-connected memory cells.

At 803, the voltage level applied to the first node, e.g., applied to the source 216, might be increased to a third voltage level, e.g., higher than the first voltage level, while the voltage level applied to the control gate of the transistor, e.g., applied to the control line 222, might be increased to a fourth voltage level lower than the third voltage level and higher than the first voltage level. A voltage difference between the third voltage level and the fourth voltage level might be equal to the desired offset for the erase operation. This action might correspond to the time period t1-t7 of FIG. 7A or FIG. 7B, for example. A rates of increase of the voltage levels of the waveforms 770 and 772 might be equal during the time period t1-t7 of FIG. 7A or FIG. 7B. For some embodiments, in addition to being equal, the rates of increase of the voltage levels of the waveforms 770 and 772 might be constant or variable during the time period t1-t7 of FIG. 7A or FIG. 7B.

At 805, while the voltage level applied to the first node, e.g., applied to the source 216, is at the third voltage level, a particular voltage level might be applied to a control gate of a memory cell of the string of series-connected memory cells that might be expected to remove charge from a data storage structure of the memory cell. This action might correspond to the time period t7-t8 of FIG. 7A or FIG. 7B, for example. For some embodiments, this particular voltage level might further be applied before the voltage level applied to the first node is at the third voltage level, e.g., while the voltage level applied to the first node is increasing to the third voltage level. For example, the particular voltage level might be applied at time t0 of FIG. 7A or FIG. 7B.

Figure 9:
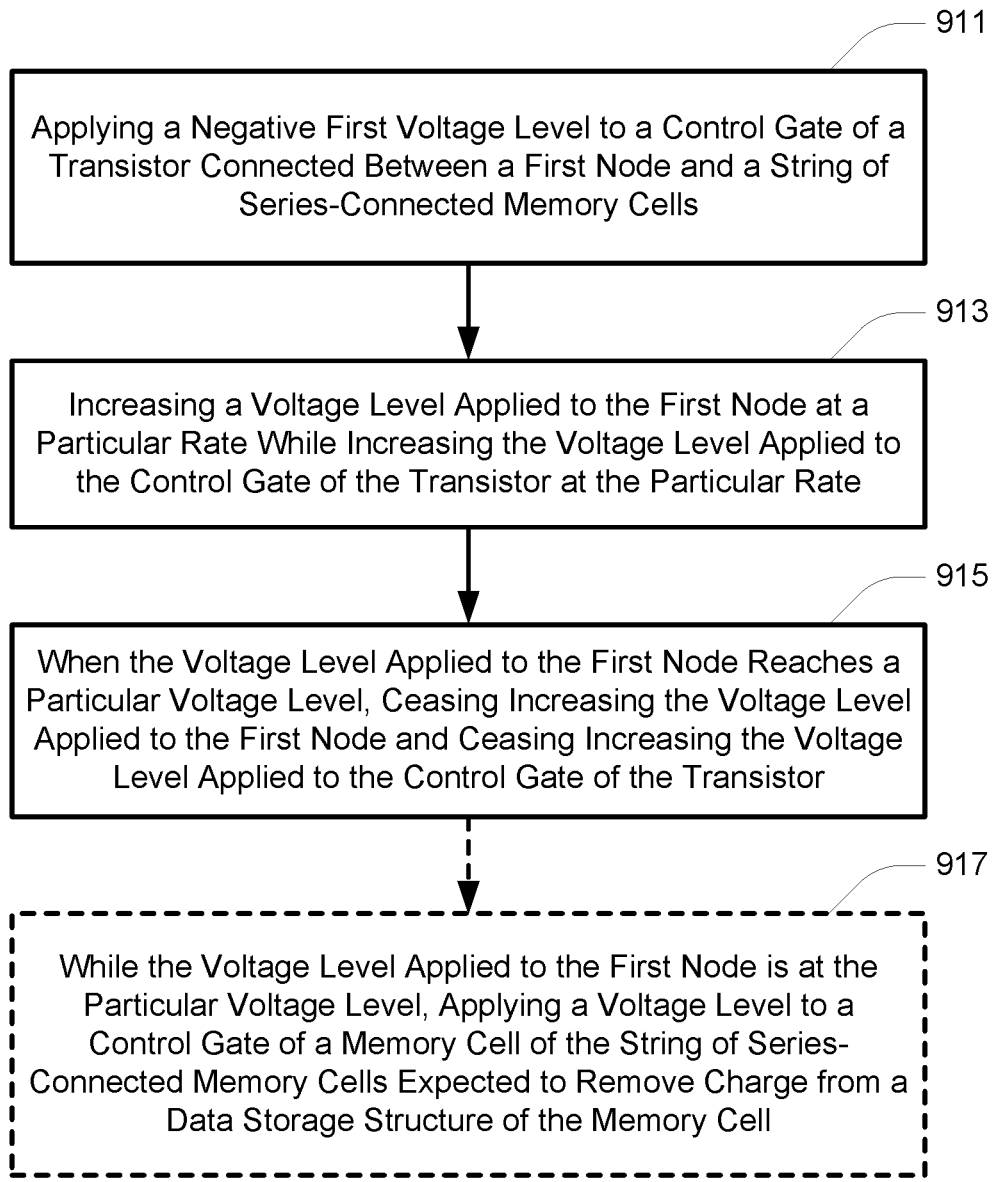
FIG. 9 is a flowchart of a method of operating a memory in accordance with another embodiment.

FIG. 9 is a flowchart of a method of operating a memory in accordance with another embodiment. For example, the method of FIG. 9 might represent a portion of an erase operation.

At 911, a negative first voltage level might be applied to a control gate of a transistor connected between a first node and a string of series-connected memory cells, which might be directly connected to the first node and connected (e.g., selectively or directly) to the string of series-connected memory cells. As an example, with reference to FIG. 2A, the first voltage level might be applied to the control line 222. Alternatively, the first voltage level might be applied to the control line 224. The first voltage level might have a magnitude equal to the desired offset for the erase operation. This action might correspond to the voltage level of waveform 772 at time t1 of FIG. 7A, or to the voltage level of waveform 772 at time t0 of FIG. 7B, for example.

While it will be understood that the method of FIG. 9 might be performed with respect to the source 216 and the control line 222, and/or with respect to a data line 204 (e.g., or a plurality of data lines 204) and the control line 224, the remaining discussion of FIG. 9 will be described with reference to the source 216 corresponding to the first node selectively connected to a string of series-connected memory cells, and the control line 222 corresponding to the voltage level applied to the control gate of a transistor 218 connected to the first node and selectively connected to the string of series-connected memory cells.

At 913, a voltage level applied to the first node, e.g., applied to the source 216, might be increased at a particular rate while the voltage level applied to the control gate of the transistor, e.g., applied to the control line 222, might be increased at the particular rate, e.g., concurrently. The particular rate of increase might represent a constant rate of increase, or a variable rate of increase. In this manner, a voltage difference between the voltage level applied to the first node and the voltage level applied to the control gate of the transistor might be deemed to be maintained at a constant value, e.g., equal to the desired offset of the erase operation. This action might correspond to the time period t1-t7 of FIG. 7A, or to the time period t0-t7 of FIG. 7B, for example. As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time.

At 915, when the voltage level applied to the first node, e.g., applied to the source 216, reaches a particular voltage level, increases to the voltage levels applied to the first node, and increases to the voltage levels applied to the control gate of the transistor, e.g., applied to the control line 222, might be ceased. This action might correspond to time t7 of FIG. 7A, or FIG. 7B, for example.

At 917, while the voltage level applied to the first node, e.g., applied to the source 216, is at the particular voltage level, a voltage level might be applied to a control gate of a memory cell of the string of series-connected memory cells that might be expected to remove charge from a data storage structure of the memory cell. This action might correspond to the time period t7-t8 of FIG. 7A or FIG. 7B, for example.

Figure 10:
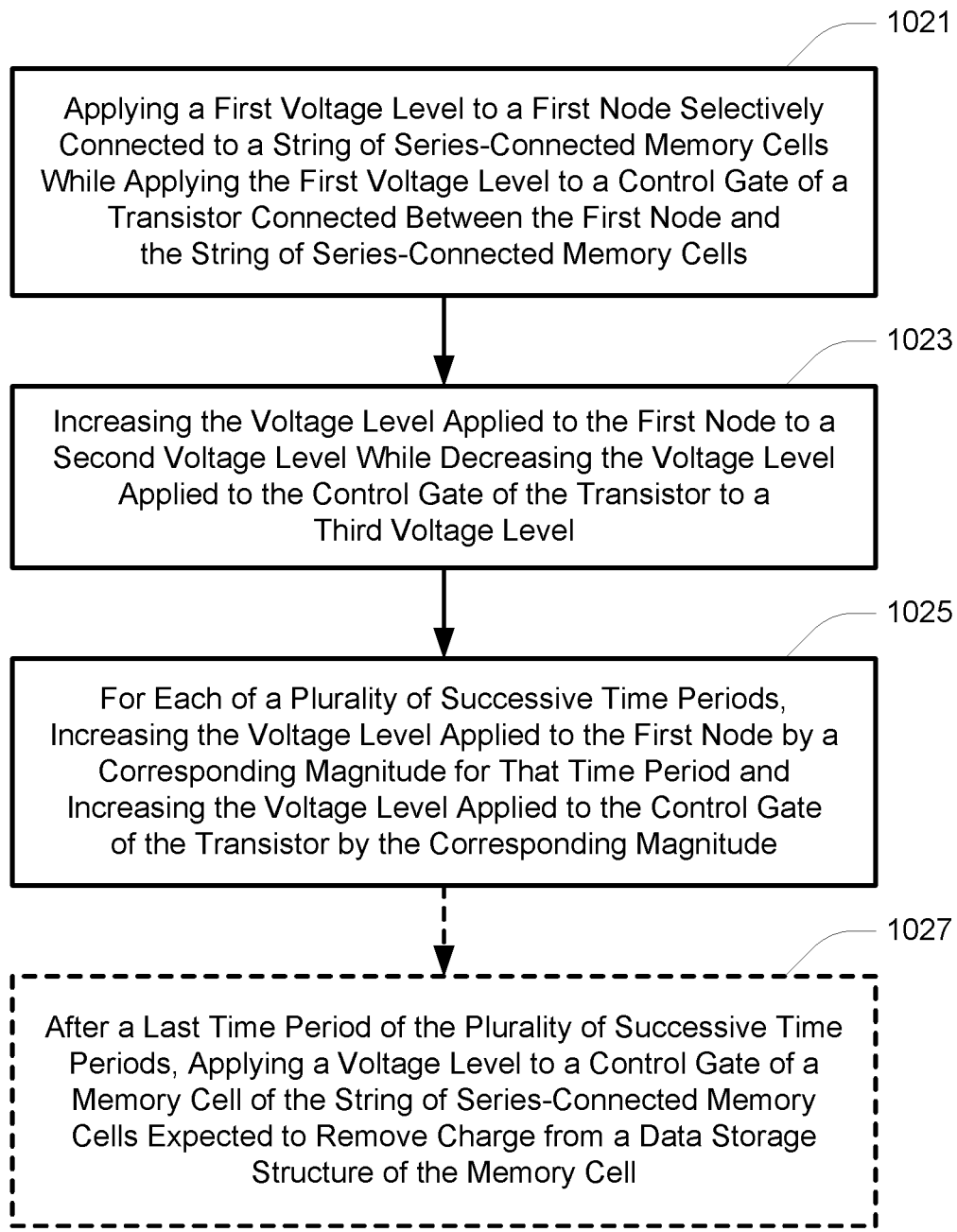
FIG. 10 is a flowchart of a method of operating a memory in accordance with a further embodiment.

FIG. 10 is a flowchart of a method of operating a memory in accordance with a further embodiment. For example, the method of FIG. 10 might represent a portion of an erase operation.

At 1021, a first voltage level might be applied to a first node selectively connected to a string of series-connected memory cells while applying the first voltage level to a control gate of a transistor connected between the first node and the string of series-connected memory cells, which might be directly connected to the first node and connected (e.g., selectively or directly) to the string of series-connected memory cells. As an example, with reference to FIG. 2A, the first voltage level might be applied to the source 216 and to the control line 222. Alternatively, the first voltage level might be applied to the data line $204_0$ and to the control line 224. This action might correspond to time t0 of FIG. 7A, for example. The first voltage level might correspond to a ground or 0V, for example.

While it will be understood that the method of FIG. 10 might be performed with respect to the source 216 and the control line 222, and/or with respect to a data line 204 (e.g., or a plurality of data lines 204) and the control line 224, the remaining discussion of FIG. 10 will be described with reference to the source 216 corresponding to the first node selectively connected to a string of series-connected memory cells, and the control line 222 corresponding to the voltage level applied to the control gate of a transistor 218 connected to the first node and selectively connected to the string of series-connected memory cells.

At 1023, the voltage level applied to the first node, e.g., applied to the source 216, might be increased to a second voltage level while the voltage level applied to the control gate of a transistor, e.g., applied to the control line 222, might be decreased to a third voltage level. A voltage difference between the second voltage level and the third voltage level might be equal to the desired offset for the erase operation. This action might correspond to the voltage level increase of waveform 770 at time t0 of FIG. 7A and to the voltage level decrease of waveform 772 at time t0 of FIG. 7A, for example.

At 1025, for each of a plurality of successive time periods, the voltage level applied to the first node, e.g., applied to the source 216, might be increased by a corresponding magnitude for that time period, and the voltage level applied to the control gate of the transistor, e.g., applied to the control line 222, might be increased by the corresponding magnitude for that time period. This action might correspond to the voltage level increases of waveforms 770 and 772 for the successive time periods, e.g., t1-t2, t2-t3, t3-t4, etc. of time period t1-t7, of FIG. 7A, for example, where $780_1$ minus $780_0$ might equal $784_1$ minus $784_0$, $780_2$ minus $780_1$ might equal $784_2$ minus $784_1$, $780_X$ minus $780_2$ might equal $784_X$ minus $784_2$, etc.

At 1027, after a last time period of the plurality of successive time periods, e.g., time period t6-t7, a voltage level might be applied to a control gate of a memory cell of the string of series-connected memory cells that might be expected to remove charge from a data storage structure of the memory cell. This action might correspond to the time period t7-t8 of FIG. 7A, for example.

Figure 11:
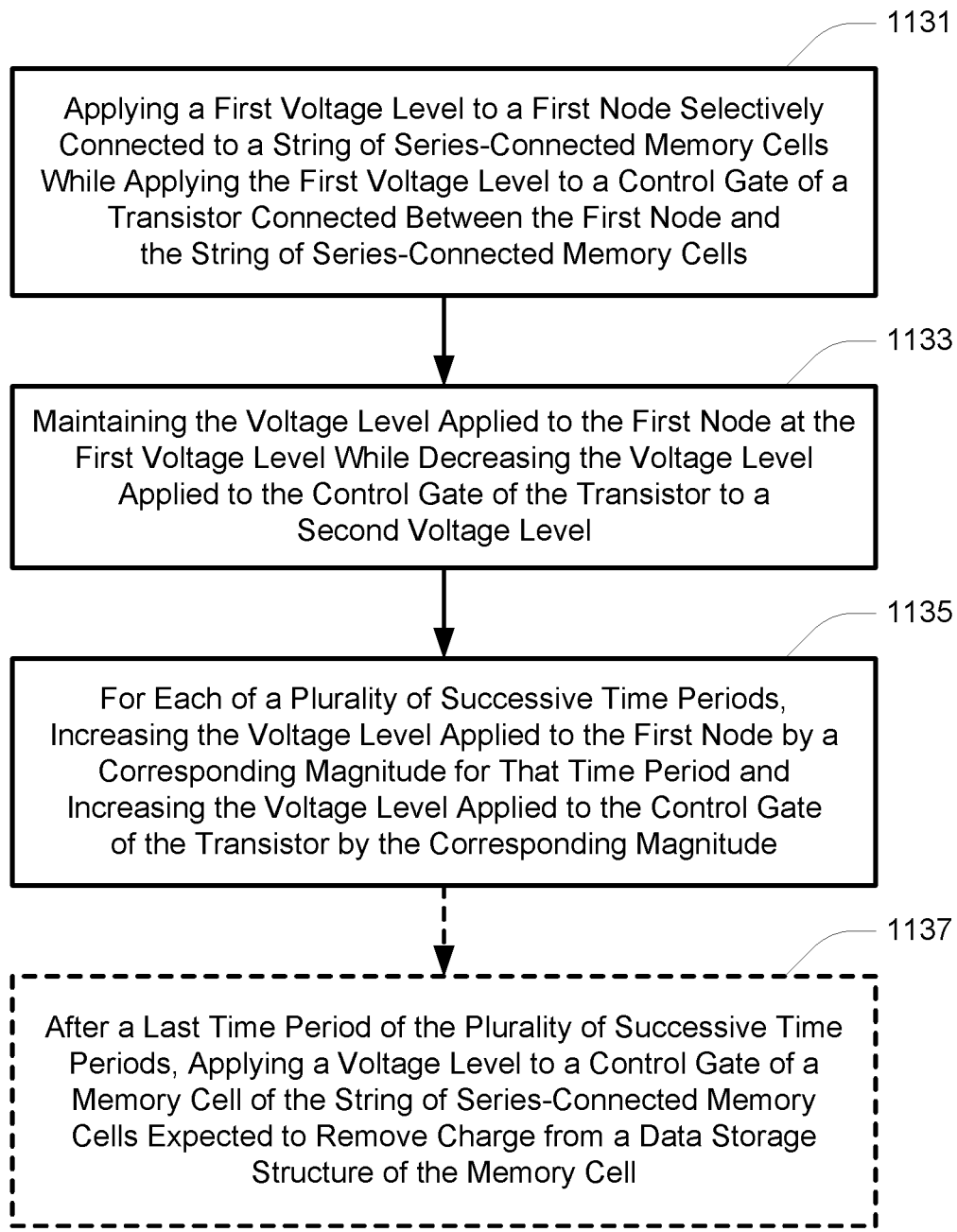
FIG. 11 is a flowchart of a method of operating a memory in accordance with a still further embodiment.

FIG. 11 is a flowchart of a method of operating a memory in accordance with a still further embodiment. For example, the method of FIG. 11 might represent a portion of an erase operation.

At 1131, a first voltage level might be applied to a first node selectively connected to a string of series-connected memory cells while applying the first voltage level to a control gate of a transistor connected between the first node and the string of series-connected memory cells, which might be directly connected to the first node and connected (e.g., selectively or directly) to the string of series-connected memory cells. As an example, with reference to FIG. 2A, the first voltage level might be applied to the source 216 and to the control line 222. Alternatively, the first voltage level might be applied to the data line $204_0$ and to the control line 224. This action might correspond to time $t_i$ of FIG. 7B, for example. The first voltage level might correspond to a ground or 0V, for example.

While it will be understood that the method of FIG. 11 might be performed with respect to the source 216 and the control line 222, and/or with respect to a data line 204 (e.g., or a plurality of data lines 204) and the control line 224, the remaining discussion of FIG. 11 will be described with reference to the source 216 corresponding to the first node selectively connected to a string of series-connected memory cells, and the control line 222 corresponding to the voltage level applied to the control gate of a transistor 218 connected to the first node and selectively connected to the string of series-connected memory cells.

At 1133, the voltage level applied to the first node, e.g., to the source 216, might be maintained at the first voltage level while the voltage level applied to the control gate of the transistor, e.g., applied to the control line 222, might be decreased to a second voltage level. A magnitude of the second voltage level might be equal to the desired offset for the erase operation. This action might correspond to the voltage level decrease of waveform 772 for the time period $t_i$-t0 of FIG. 7B, for example.

At 1135, for each of a plurality of successive time periods, the voltage level applied to the first node, e.g., applied to the source 216, might be increased by a corresponding magnitude for that time period, and the voltage level applied to the control gate of the transistor, e.g., applied to the control line 222, might be increased by the corresponding magnitude for that time period. This action might correspond to the voltage level increases of waveforms 770 and 772 for the successive time periods, e.g., t0-t1, t1-t2, t2-t3, etc. of time period t0-t7, of FIG. 7B, for example, where $780_0$ might equal $784_0$ minus $784_i$, where $780_1$ minus $780_0$ might equal $784_1$ minus $784_0$, $780_2$ minus $780_1$ might equal $784_2$ minus $784_1$, $780_X$ minus $780_2$ might equal $784_X$ minus $784_2$, etc.

At 1137, after a last time period of the plurality of successive time periods, e.g., time period t6-t7, a voltage level might be applied to a control gate of a memory cell of the string of series-connected memory cells that might be expected to remove charge from a data storage structure of the memory cell. This action might correspond to the time period t7-t8 of FIG. 7B, for example.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
   applying a negative first voltage level to a control gate of a transistor connected between a first node and a string of series-connected memory cells;
   increasing a voltage level applied to the first node at a particular rate while increasing the voltage level applied to the control gate of the transistor at the particular rate; and
   when the voltage level applied to the first node reaches a particular voltage level, ceasing increasing the voltage level applied to the first node and ceasing increasing the voltage level applied to the control gate of the transistor.

2. The method of claim 1, further comprising:
   while the voltage level applied to the first node is at the particular voltage level, applying a voltage level to a control gate of a memory cell of the string of series-connected memory cells expected to remove charge from a data storage structure of the memory cell.

3. The method of claim 2, further comprising applying the voltage level to the control gate of the memory cell before the voltage level applied to the first node, and increased at the particular rate, reaches the particular voltage level.

4. The method of claim 1, wherein applying the negative first voltage level to the control gate of the transistor connected between the first node and the string of series-connected memory cells comprises applying the negative first voltage level to a control gate of a transistor connected between the string of series-connected memory cells and a particular node selected from a group consisting of a source selectively connected to the string of series-connected memory cells and a data line selectively connected to the string of series-connected memory cells.

5. The method of claim 1, wherein applying the negative first voltage level to the control gate of the transistor comprises decreasing the voltage level applied to the control gate of the transistor from an initial voltage level to the first voltage level, and wherein the method further comprises:
   increasing a voltage level applied to the first node from the initial voltage level to a second voltage level while decreasing the voltage level applied to the control gate of the transistor from the initial voltage level to the first voltage level.

6. The method of claim 1, wherein applying the negative first voltage level to the control gate of the transistor comprises decreasing the voltage level applied to the control gate of the transistor from an initial voltage level to the first voltage level, and wherein the method further comprises:
   maintaining a voltage level applied to the first node at the initial voltage level while decreasing the voltage level applied to the control gate of the transistor from the initial voltage level to the first voltage level.

7. The method of claim 1, wherein increasing the voltage level applied to the first node at the particular rate comprises increasing the voltage level applied to the first node at a variable rate.

8. The method of claim 1, further comprising:
   applying a negative second voltage level to a control gate of a transistor connected between a second node and the string of series-connected memory cells;
   increasing a voltage level applied to the second node at the particular rate while increasing the voltage level applied to the control gate of the transistor connected between the second node and the string of series-connected memory cells at the particular rate; and
   when the voltage level applied to the second node reaches a third voltage level, ceasing increasing the voltage level applied to the second node and ceasing increasing the voltage level applied to the control gate of the transistor connected between the second node and the string of series-connected memory cells.

9. The method of claim 8, wherein the second voltage level equals the first voltage level, and wherein the third voltage level equals the particular voltage level.

10. The method of claim 8, wherein the first node is a data line selectively connected to the string of series-connected memory cells, and wherein the second node is a source selectively connected to the string of series-connected memory cells.

11. The method of claim 1, wherein the transistor connected between the first node and the string of series-connected memory cells comprises a single transistor directly connected to the first node and directly connected to the string of series-connected memory cells.

12. A memory, comprising:
    an array of memory cells comprising a plurality of strings of series-connected memory cells; and
    a controller for access of the array of memory cells, wherein the controller is configured to cause the memory to perform a method comprising:
        applying a negative first voltage level to a control gate of a transistor connected between a first node and a string of series-connected memory cells of the plurality of strings of series-connected memory cells;
        increasing a voltage level applied to the first node at a particular rate while increasing the voltage level applied to the control gate of the transistor at the particular rate; and
        when the voltage level applied to the first node reaches a particular voltage level, ceasing increasing the voltage level applied to the first node and ceasing increasing the voltage level applied to the control gate of the transistor.

13. The memory of claim 12, wherein the method the controller is configured to cause the memory to perform further comprises:

while the voltage level applied to the first node is at the particular voltage level, applying a voltage level to a control gate of a memory cell of the string of series-connected memory cells expected to remove charge from a data storage structure of the memory cell.

14. The memory of claim 13, wherein the method the controller is configured to cause the memory to perform further comprises applying the voltage level to the control gate of the memory cell before the voltage level applied to the first node, and increased at the particular rate, reaches the particular voltage level.

15. The memory of claim 12, wherein the controller being configured to cause the memory to perform the method comprising applying the negative first voltage level to the control gate of the transistor connected between the first node and the string of series-connected memory cells comprises the controller being configured to cause the memory to perform the method comprising applying the negative first voltage level to a control gate of a transistor connected between the string of series-connected memory cells and a particular node selected from a group consisting of a source selectively connected to the string of series-connected memory cells and a data line selectively connected to the string of series-connected memory cells.

16. A memory, comprising:
an array of memory cells comprising a plurality of strings of series-connected memory cells; and
a controller for access of the array of memory cells, wherein the controller is configured to cause the memory to:
apply a first voltage level to a first node selectively connected to a string of series-connected memory cells of the plurality of strings of memory cells while applying the first voltage level to a control gate of a transistor connected between the first node and the string of series-connected memory cells;
maintain the voltage level applied to the first node at the first voltage level while decreasing the voltage level applied to the control gate of the transistor to a second voltage level; and
for each time period of a plurality of successive time periods:
increase the voltage level applied to the first node by a corresponding magnitude for that time period; and
increase the voltage level applied to the control gate of the transistor by the corresponding magnitude for that time period.

17. The memory of claim 16, wherein the controller is further configured to cause the memory to:
after a last time period of the plurality of successive time periods, apply a voltage level to a control gate of a memory cell of the string of series-connected memory cells expected to remove charge from a data storage structure of the memory cell.

18. The memory of claim 16, wherein the corresponding magnitude for a particular time period of the plurality of successive time periods is greater than the corresponding magnitude for a subsequent time period of the plurality of successive time periods.

19. The memory of claim 18, wherein a duration of the particular time period is greater than a duration for the subsequent time period.

20. The memory of claim 18, wherein a slope of a voltage increase for the particular time period is greater than a slope of a voltage increase for the subsequent time period.

* * * * *